United States Patent [19]

Urushibata et al.

[11] Patent Number: 5,045,641
[45] Date of Patent: Sep. 3, 1991

[54] MOULDED ELECTRICAL CONNECTOR AND METHOD FOR MANUFACTURING SAME

[75] Inventors: Kenichi Urushibata; Keiichi Kojima; Kiyoto Sugawara; Tatsuo Matsuda; Haruo Saen, all of Tochigi; Tetsuo Yumoto, Tokyo; Norio Yoshizawa, Tokyo; Tooru Kanno, Tokyo, all of Japan

[73] Assignees: Sankyo Kasei Co., Ltd., Tokyo; Sumitomo Electric Industries, Ltd., Osaka, both of Japan

[21] Appl. No.: 468,936

[22] Filed: Jan. 23, 1990

[30] Foreign Application Priority Data

Jan. 26, 1989 [JP]  Japan ..................... 1-16787

[51] Int. Cl.$^5$ ..................... H02G 15/02; H01R 4/02
[52] U.S. Cl. ..................... 174/74 R; 29/860; 174/71 R; 174/88 R; 219/56.22; 439/736
[58] Field of Search ............ 174/71 R, 74 R, 88 R; 439/492, 493, 736, 874, 876, 499; 29/858, 859, 860, 848; 219/56.1, 56.21, 56.22

[56] References Cited

U.S. PATENT DOCUMENTS

| | | | |
|---|---|---|---|
| 3,083,261 | 3/1963 | Francis et al. | 174/88 R |
| 3,231,710 | 1/1966 | Barnet et al. | 219/56.22 |
| 3,259,873 | 7/1966 | Parkinson et al. | 174/88 R |
| 3,448,431 | 6/1969 | Adrien | 439/874 X |
| 3,553,632 | 1/1971 | Hildebrand et al. | 439/736 X |
| 3,697,925 | 10/1972 | Henschen | 439/494 |
| 4,489,228 | 12/1984 | Wells et al. | 219/56.22 |
| 4,602,830 | 7/1986 | Lockard | 439/108 |
| 4,795,079 | 1/1989 | Yamada | 174/88 X |
| 4,815,814 | 3/1989 | Ulijasz | 174/71 R X |

FOREIGN PATENT DOCUMENTS 2081892 12/1971 France .
1317264 5/1973 United Kingdom .

*Primary Examiner*—Morris H. Nimmo
*Attorney, Agent, or Firm*—Cushman, Darby & Cushman

[57] ABSTRACT

A molded electrical connector for connecting electrical conductors comprises a molding section in which a plurality of metallic circuits are arranged in parallel with one another at predetermined intervals and are fixedly molded with resin such that first end portions of the metallic circiuts are exposed as connecting terminals. The molded electrical connector further comprises a connecting section which comprises the connecting terminals. The connecting section is molded with resin simultaneously when the molding section is formed. Electrical conductors are placed on the connecting terminals of the metallic circuits and welded together.

28 Claims, 4 Drawing Sheets

MOULDED ELECTRICAL CONNECTOR AND METHOD FOR MANUFACTURING SAME

BACKGROUND OF THE INVENTION

1. Field of Invention

This invention relates in general to domestic, industrial or vehicle internal wiring. More specifically, the invention relates to a molded electrical connector for connecting lead wires to a flat type cable and a method of manufacturing a molded electrical connector.

2. Description of the Prior Art

Typically a connector is used to connect terminals of a printed circuit board to respective conductors of a flat type cable. One arrangement for achieving a good mechanical and electrical connection is to solder the wires to their respective terminals. However, in the case of a printed circuit board installed on a vehicle or the like which may be vibrated during operation, it is difficult to maintain good electrical and mechanical characteristics in the soldered joint for an extended time. Therefore, to achieve higher reliability, it is preferable to spot weld.

FIG. 1 (PRIOR ART) shows a conventional arrangement of connecting lead wires to a flat type cable. In FIG. 1 (PRIOR ART), a flat box-shaped molding 1 includes a plurality of metallic circuits 2. Metallic circuits 2 extend from molding 1 as connecting terminals 3 which are substantially rectangular conductors. A flat type cable 11 includes welding portions 8 and rectangular conductors 12. The metallic circuits 2 are molded in molding 1 in such a manner that they are arranged at predetermined intervals in a plane with the terminals 3 protruding from the molding 1. The molding 1 and the connecting terminals 3 form a molded electrical connector. The connecting terminals 3 and the end portions of the rectangular conductors 12 are fully exposed, can be placed on each other, pressed together with the electrodes of a spot welder from above and below and spot welded. However, it is rather difficult to position the terminals 3 and the rectangular conductors 12. They can easily shift from the desired position before being spot welded.

Employment of a spot welder to weld conductors to the connecting terminals of a molded electrical connector/printed circuit board combination presents an additional problem. Since the connector is formed over the insulating material of the circuit board as described above, no current can flow between the electrodes of the spot welder disposed on both sides of the printed circuit board because of the insulating material thereof.

FIG. 2 (PRIOR ART) shows a conventional molded electrical connector whose connecting terminals 3 are combined with a printed circuit board. In this case, the lower surfaces of the connecting terminals 3 are covered with the insulating material of the printed circuit board. At the positions of the connecting terminals, the upper and lower portions of the circuit board are not conductive. Hence, at these positions, spot welding cannot be performed without means for rendering the upper and lower portions of the circuit board conductive.

SUMMARY OF THE INVENTION

The above-described problems have been solved by the present invention molded electrical connector and method of manufacturing it. The molded electrical connector comprises: a molding section in which a plurality of metallic circuits arranged in parallel with one another at predetermined intervals are fixedly molded with resin in such a manner that first end portions thereof are exposed as connecting terminals; a connecting section in which the connecting terminals are molded with the resin when the molding section is formed, in such a manner that 1) resin layers are formed around the connecting terminals which are equal in thickness to the connecting terminals, or 2) no resin layer is formed between the connecting terminal, with the upper and lower surfaces of the connecting terminals exposed, or 3) the resin layer surrounding the connecting terminals is smaller in thickness than the other resin layers.

The method of constructing the molded electrical connector comprises the steps of: arranging the plurality of metallic circuits in parallel with one another; molding first portions of the metallic circuits into a first connector section such that second portions of the metallic circuits are exposed to act as connecting terminals; molding the connecting terminals into a second connector section. The method can further comprise the steps of 1) molding resin layers between the connecting terminals such that the resin layers are generally equal in thickness to the connecting terminals and upper and lower surfaces of the connecting terminals are exposed; or 2) molding side reinforcing members extending from each side of the first connector section and molding an end reinforcing member which connects outer ends of the side reinforcing members and supports the connecting terminals; or 3) molding resin layers near the connecting terminals which are generally equal in thickness to the connecting terminals such that upper and lower surfaces of the connecting terminals are exposed and molding a surrounding resin layer which surrounds the aforementioned resin layers and which is thicker than the connecting terminals and which supports outer portions of the connecting terminals. The molding steps can all be done simultaneously.

The molded electrical connector is connected to the conductors by placing the electrical conductors on the connecting terminals of the metallic circuits to define welding portions; spot welding the welding portions; and covering the molded electrical connector, including the connecting section, by resin molding.

With the foregoing in mind, other objects, features and advantages of the present invention will become more apparent upon consideration of the following description and the appended claims with reference to the accompanying drawings, all of which form part of this specification, wherein like reference numerals designate corresponding parts and various figures.

DETAILED DESCRIPTION OF THE PREFERRED EMBODIMENTS

Figure 1:
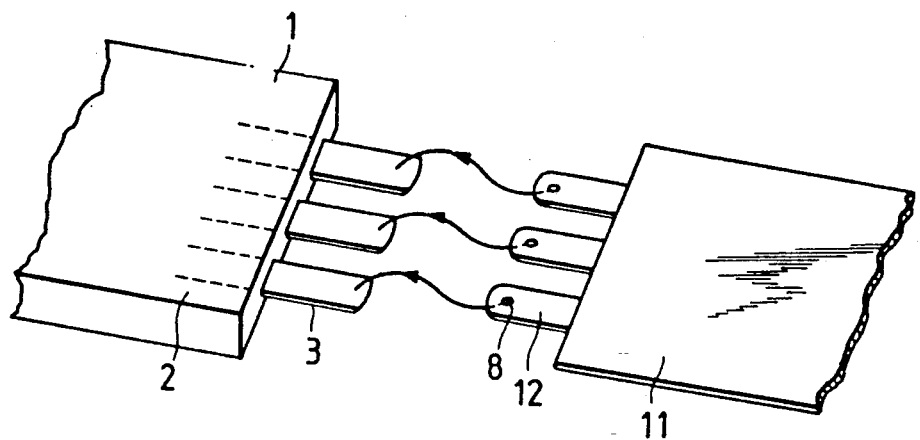
FIG. 1 (PRIOR ART) is a diagrammatic view showing a conventional molded electrical connector and method for attaching it to a flat type cable.
Figure 2:
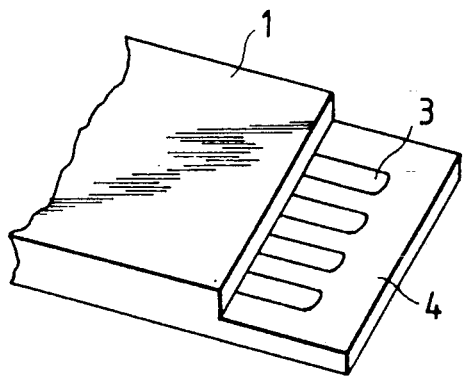
FIG. 2 (PRIOR ART) is a perspective view showing a conventional molded electrical connector/printed circuit board combination.
Figure 3:
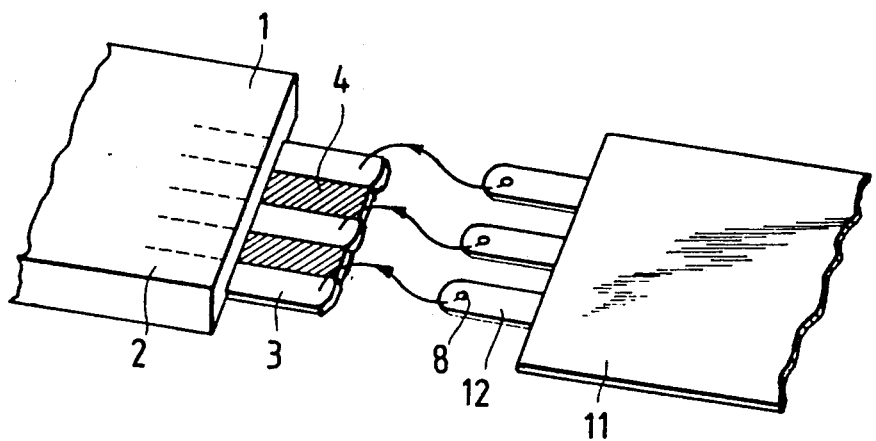
FIG. 3 is a diagrammatic view showing a first embodiment of a molded electrical connector according to the invention.

FIG. 3 shows a first embodiment of a molded electrical connector according to the invention. In FIG. 3, those components which have been already described with reference to FIG. 1 (PRIOR ART) are therefore designated by the same reference numerals. Further in FIG. 3, reference numeral 4 designates molded resin stabilizers. In the molded electrical connector, the resin of the molding 1 fixes the arranged metal circuits at equal intervals, and enters the spaces between the connecting terminals 3, thus forming the aforementioned molded resin stabilizers 4. The upper and lower surfaces of the molded resin stabilizers 4 are flush with the upper and lower surfaces of the connecting terminals 3, respectively. In other words, the molded resin stabilizers 4 are generally equal in thickness to the connecting terminals 3. Therefore, the upper and lower surfaces of the connecting terminals are exposed, allowing the electrodes of the welder to contact them directly.

In a spot welding operation, the spot welder is positioned according to the configuration of the molding 1. With the rectangular conductors 12 of the flat type cable and the exposed connecting terminals 3 placed on each other, the electrodes of the spot welder are pushed against them from above and below. Since the upper and lower surfaces of the connecting terminals 3 are flush with the upper and lower surfaces, respectively, of the molded resin stabilizers 4, the welder can be accurately positioned with respect to the connecting terminals 3. The connecting terminals 3 will not shift sidewardly, nor will the electrodes be shifted when pushing the connecting terminal and the conductor. Thus, the spot welding operation can be achieved with high accuracy.

In one example of an embodiment of this method, metallic circuits 2 formed by blanking a tin-plated brass plate (0.64 mm in thickness) are arranged in the same plane such that they are spaced at the same intervals as the conductors of the flat type cable. A molding operation is then carried out with a thermoplastic resin of liquid crystal polymer or the like, having excellent dimensional stability, so that a molding 1 having a thickness of 1.0 mm is formed over the metallic circuits 2 and the molded resin stabilizers 4 are formed between the connecting terminals 3 such that the former are generally equal in thickness to the latter.

Figure 4:
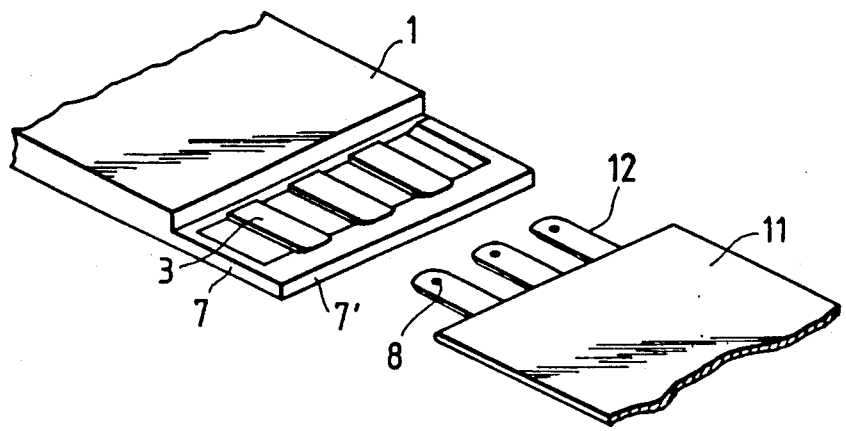
FIG. 4 is a diagrammatic view showing a second embodiment of a molded electrical connector according to the invention.

FIG. 4 shows a second embodiment of the molded electrical connector according to the invention. The second embodiment employs two side reinforcing members 7, and an end reinforcing member 7' instead of the molded resin stabilizers 4 in the first embodiment described above. These members are formed simultaneously when the molding body 1 is formed such that the two side reinforcing members 7 are extended along the connecting terminals 3 from both sides of the molding body 1, respectively, and the end reinforcing member 7' is connected to the ends of the two side reinforcing members 7 and supports the outer ends of the connecting terminals 3. Thus, the connecting terminals are supported at both ends. Hence, when the electrodes are pushed against the welding portions, the shifting of the connecting terminal 3 is positively prevented and the distances between the connecting terminals remain unchanged at all times.

The molded electrical connector shown in FIG. 4 is connected to a flat type cable by placing the rectangular conductors 12 of the flat type cable on the connecting terminals 3, respectively, and spot welding the layer with the electrodes of the spot welder abutted against both sides of the layer. Since the upper and lower surfaces of the connecting terminals 3 are exposed, the electrodes of the spot welder can be brought into contact with the connecting terminals 3 with ease. Furthermore, since the connecting terminals 3 are fixed in position by the end reinforcing member 7', they will not shift but are kept positioned with high accuracy. This allows a stable spot welding operation.

Figure 5:
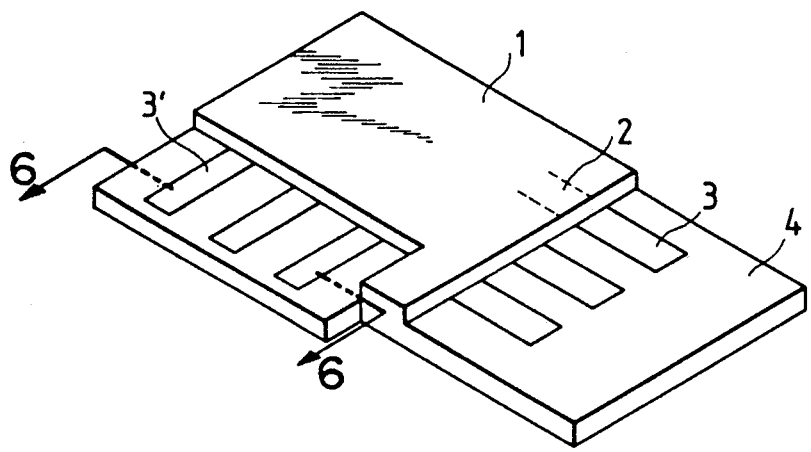
FIG 5 is a perspective view showing a combination molded electrical connector according to the invention.
Figure 6:
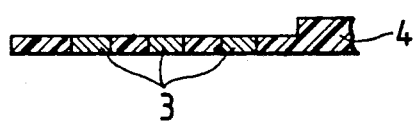
FIG. 6 is a sectional view taken along line 6—6 in FIG. 5.

FIG. 5 shows a molded electrical connector which is a combination of the first and second embodiments of the molded electrical connector shown in FIGS. 3 and 4. In this combination connector, the input and output directions form right angles and the connector is substantially L-shaped. Accordingly, the metallic circuits 2 are L-shaped, having connecting terminals 3 and 3'. The connecting terminals 3 and the molded resin stabilizers 4 are shown in FIG. 6, a sectional view taken along line 5—5 in FIG. 5. The molded resin stabilizers 4 between the connecting terminals 3 are generally equal in thickness to the terminals 3, and the molded resin stabilizer 4 in the periphery is lengthened for reinforcement. In other words, the L-shaped metallic circuits 2 are molded such that in the vicinity of the connecting terminals 3, the molded resin stabilizers 4 are generally equal in thickness to the connecting terminals 3 such that the upper and lower surfaces of the terminals 3 are exposed, and the portion of the molded resin stabilizer 4 near the ends of the terminals 3 is lengthened to more positively support the ends of the terminals 3.

Figure 7:
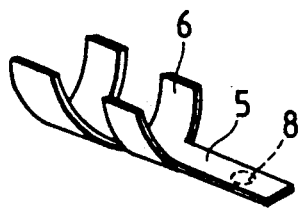
FIG. 7 (PRIOR ART) is a perspective view showing a clamping relay terminal.
Figure 8:
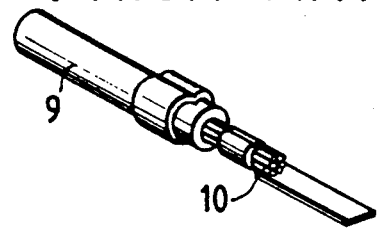
FIG. 8 (PRIOR ART) is a perspective view showing the clamping relay terminal connected to a round cable.

FIG. 7 (PRIOR ART) shows a conventional clamping relay terminal, and FIG. 8 (PRIOR ART) shows a round cable clamped with the conventional clamping relay terminal. In FIGS. 7 (PRIOR ART) and 8 (PRIOR ART), reference numeral 5 designates the clamping relay terminal; 6, round conductor clamping ears; 8, a welding portion; 9, a round cord; and 10, the conductor of the round cord 9. The clamping relay terminal 5, which can be tin-plated, is connected to the conductors 10 of the round cable 9 by clamping them with the round conductor clamping ears 6 thereof.

Figure 9:
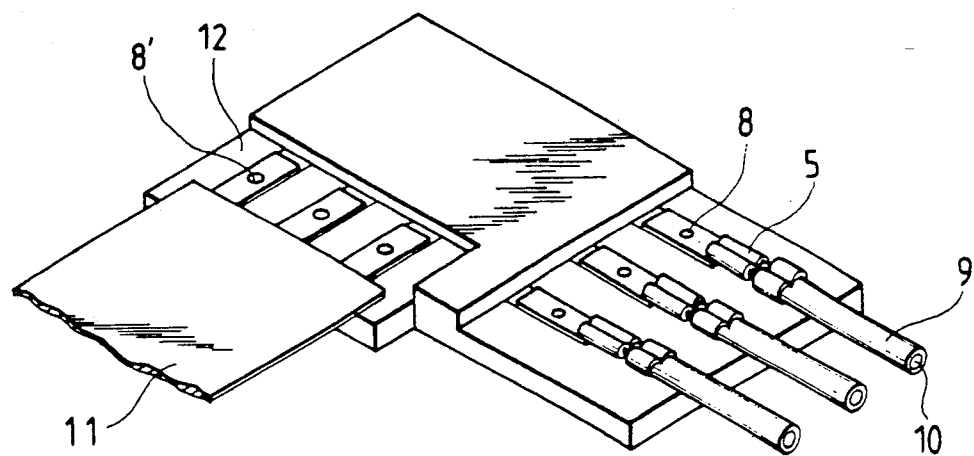
FIG. 9 is a diagrammatic view showing the first embodiment molded electrical connector connected to a flat type cable etc.

FIG. 9 shows a molded electrical connector to which a flat type cable 11 and the clamping relay terminals 5 are connected. In one embodiment, the flat type cable 11 is 0.35 mm thick, and the rectangular conductors are 0.15 mm thick and 1.8 mm wide and are arranged at intervals of 3.5 mm. In addition, the molded electrical connector is so designed that the connecting terminals 3 at one end portion thereof are spaced at the same intervals as the conductors of the cable. The connecting terminals 3 at the other end portion thereof are wide enough to be connected to the welding portions 8 of the clamping relay terminals 5. The welding portions 8 and 8' are connected to the connecting terminals 3 by spot welding. Since the connecting terminals 3 are flush with the molding adjacent thereto, the welding electrodes can readily reach the welding portions from both sides, so that spot welding is easily accomplished.

Figure 10:
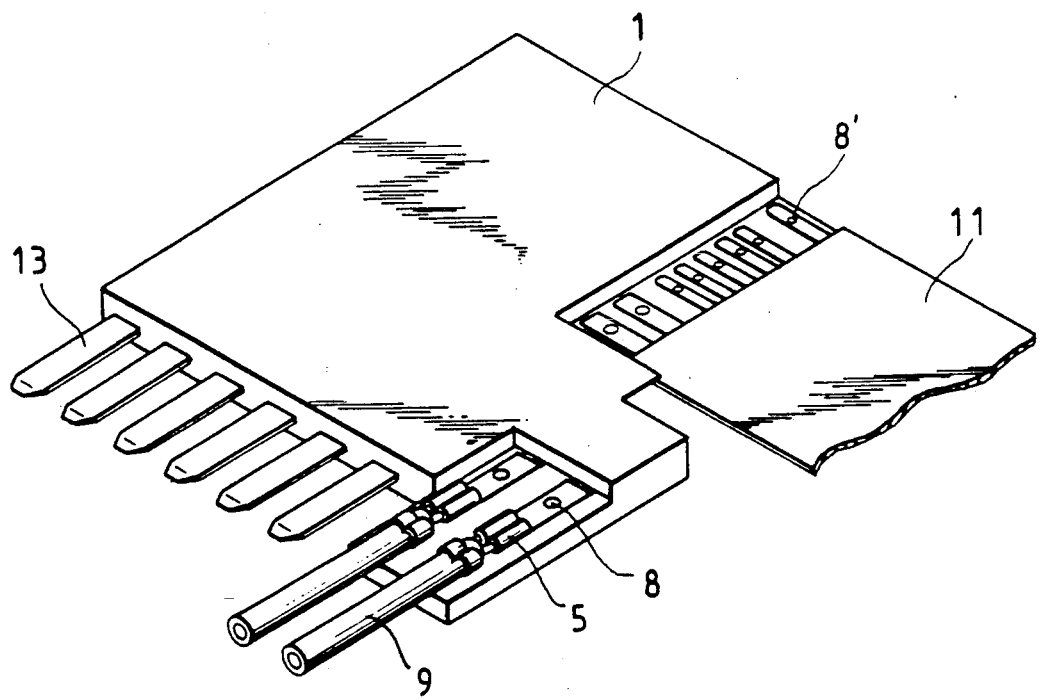
FIG. 10 is a perspective view showing an alternative embodiment molded electrical connector according to the invention.

FIG. 10 shows an alternative embodiment molded electrical connector according to the invention. This connector is designed so that terminal pins 13 are provided at its end portion to which lead wires can be detachably connected with ease.

Figure 11:
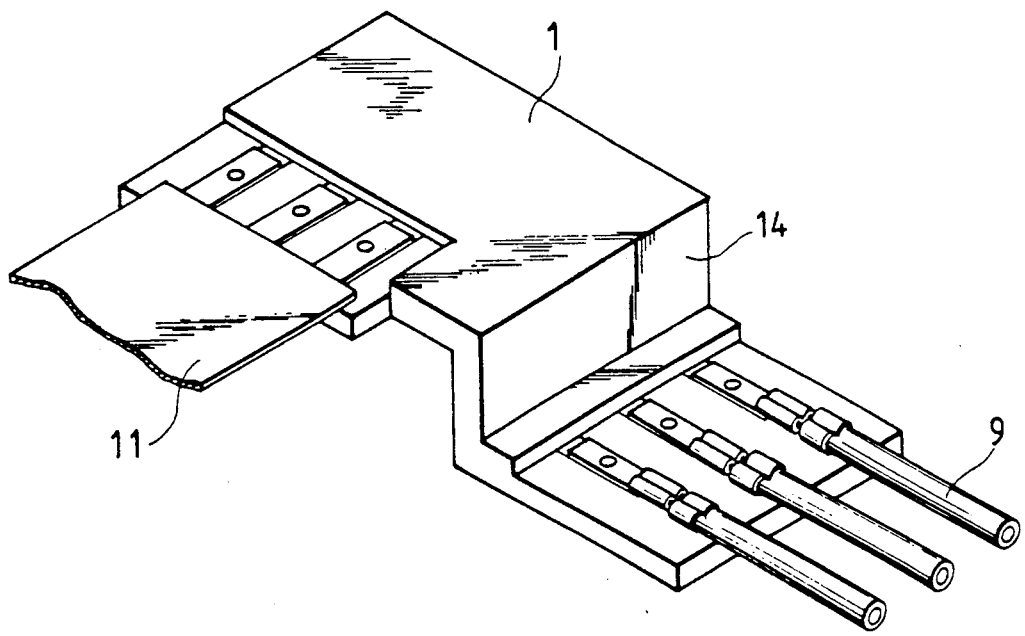
FIG. 11 is a perspective view showing an alternative embodiment molded electrical connector according to the invention.

FIG. 11 shows an alternative embodiment molded electrical connector according to the invention in which its lead wire providing portion is in the form of a step. With this connector, a flat type cable can be extended smoothly in a case where the cable 11 is required to lay at a different height than the cables 9 as indicated at 14 in FIG. 11. Thus, it is unnecessary to bend the flat type cable. This embodiment is durable against tensile stress, high in reliability, and can be installed with ease.

Figure 12:
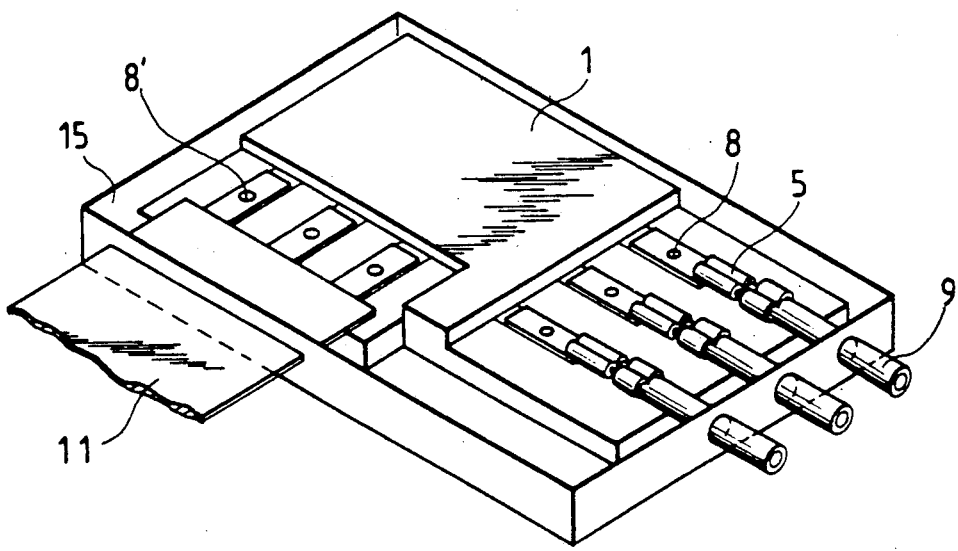
FIG. 12 is a perspective view showing an alternative embodiment molded electrical connector according to the invention.

FIG. 12 shows an alternative embodiment molded electrical connector according to the invention which is formed by further molding with polyacetate resin or the like, the molded electrical connector shown in FIG. 9 to which a flat type cable has been connected. In this case, depending on the entire available space, the lead wires and the covered portions of the flat type cable at the connecting end are contained in a molded container 15. Thus, with this connector, the resistance against the withdrawing or bending of the components connected thereto is increased, and moisture resistance, chemical resistance and other resistance against environmental change are increased.

The provision of the molded electrical connector according to the present invention will facilitate the positioning of electrodes in a spot welding operation, the connecting of flat type cables or lead wires, and the spot welding operation itself. The molded electrical connector can be effectively used as a circuit connecting element in vehicles in which the connections should be made with high reliability, especially a circuit connecting means for air bag systems.

While the invention has been described in accordance with what is presently conceived to be the most practical and preferred embodiments, it is to be understood that the invention is not to be limited to the disclosed embodiments but on the contrary, is intended to cover various modifications and equivalent arrangements included within the spirit and the scope of the appended claims, which scope is to be accorded the broadest interpretation of such claims so as to encompass all such equivalent structures.

We claim:

1. A molded electrical connector for connecting electrical conductors comprising:
    a central retaining section in which a plurality of metallic circuits are arranged in parallel with one another at predetermined intervals and central portions of the metallic circuits are fixedly molded with resin; and
    a first connecting section monolithically extending from a first side of the central retaining section, comprising:
        exposed first end portions of the metallic circuits functioning as first connecting terminals with upper and lower surfaces of the first connecting terminals being exposed; and
        connecting terminal reinforcing means to reinforce the exposed first connecting terminals, wherein the connecting terminal reinforcing means comprises resin layers formed between the first connecting terminals, the resin layers being generally equal in thickness to the first connecting terminals.

2. The apparatus of claim 1, wherein the connecting terminal reinforcing means comprises side reinforcing members extending from opposing ends of the first side of the central retaining section and an end reinforcing member connecting the outer ends of the side reinforcing members and outer ends of the first connecting terminals to support the outer ends of the first connecting terminals.

3. The apparatus of claim 1, wherein the connecting terminal reinforcing means comprises an end reinforcing member connecting the resin layers and outer ends of the first connecting terminals to support the outer ends of the first connecting terminals.

4. The apparatus of claim 1, wherein the molded electrical connector comprises;
    a second connecting section monolithically extending from a second side of the central retaining section comprising second exposed end portions of the metallic circuits functioning as second connecting terminals.

5. The apparatus of claim 4, wherein the first and second connecting sections extend from the central retaining body at an angle to each other.

6. The apparatus of claim 4, wherein the first and second connecting sections lie in different planes.

7. The apparatus of claim 6, wherein the different planes are generally parallel to each other.

8. The apparatus of claim 1, wherein the molded electrical connector is covered with resin.

9. A method for manufacturing a molded electrical connector comprising the steps of:
    arranging a plurality of metallic circuits in parallel with one another;
    molding central portions of the metallic circuits into a central retaining section such that upper and lower surfaces of first end portions of the metallic circuits are exposed in a first connector section monolithically extending from a first side of the central retaining section and upper and lower surfaces of second end portions of the metallic circuits are exposed in a second connector section monolithically extending from a second side of the central retaining section, the first and second connector sections for connecting together different sets of electrical conductors through the metallic circuits.

10. The method of claim 9, including the further step of molding resin layers between the second end portions of the metallic circuits such that the resin layers are generally equal in thickness to the metallic circuits and upper and lower surfaces of the second end portions of the metallic circuits remain exposed.

11. The method of claim 9, including the further steps of:
    molding side reinforcing members which extend from opposing ends of the first side of the first connector section; and molding an end reinforcing member which connects outer ends of the side reinforcing members and outer ends of the first end portions of the metallic circuits to support the metallic circuits.

12. The method of claim 11, wherein the molding steps are done simultaneously.

13. The method of claim 9, including the further steps of:

molding resin layers between the second end portions of the metallic circuits which are generally equal in thickness to the metallic circuits such that upper and lower surfaces of the metallic circuits are exposed; and molding an end reinforcing member which connects outer ends of the resin layers and outer ends of the second end portions of the metallic circuits to support the second end portions of the metallic circuits.

14. The method of claim 13, wherein the molding steps are done simultaneously.

15. The method of claim 12, including the further steps of:

placing the electrical conductors on the second end portions of the metallic circuits; and welding the metallic circuits to the electrical conductors.

16. The method of claim 11, including the further steps of:

placing the electrical conductors on the second end portions of the metallic circuits; and welding the metallic circuits to the electrical conductors.

17. The method of claim 13, including the further steps of:

placing the electrical conductors on the second end portions of the metallic circuits; and welding the metallic circuits to the electrical conductors.

18. The method of claim 15, including the further step of covering the molded electrical connector with resin.

19. The method of claim 16, including the further step of covering the molded electrical connector with resin.

20. The method of claim 17, including the further step of covering the molded electrical connector with resin.

21. A molded electrical connector for connecting electrical conductors comprising:

a central retaining section in which a plurality of metallic circuits are arranged in parallel with one another at predetermined intervals and central portions of the metallic circuits are fixedly molded with resin; and a first connecting section monolithically extending from a first side of the central retaining section, comprising:

exposed first end portions of the metallic circuits functioning as first connecting terminals with upper and lower surfaces of the first connecting terminals being exposed; and connecting terminal reinforcing means to reinforce the exposed first connecting terminals, wherein the connecting terminal reinforcing means comprises side reinforcing members extending from opposing ends of the first side of the central retaining section and an end reinforcing member connecting outer ends of the side reinforcing members and outer ends of the first connecting terminals to support the outer ends of the first connecting terminals.

22. The apparatus of claim 21, wherein the connecting terminal reinforcing means comprises resin layers formed between the first connecting terminals, the resin layers being generally equal in thickness to the first connecting terminals.

23. The apparatus of claim 22, wherein the the end reinforcing member is connected to outer ends of the resin layers and outer ends of the first connecting terminals to support the outer ends of the first connecting terminals.

24. The apparatus of claim 21, wherein the molded electrical connector comprises;

a second connecting section monolithically extending from a second side of the central retaining section comprising second exposed end portions of the metallic circuits functioning as second connecting terminals.

25. The apparatus of claim 24, wherein the first and second connecting sections extend from the central retaining body at an angle to each other.

26. The apparatus of claim 24, wherein the first and second connecting sections lie in different planes.

27. The apparatus of claim 26, wherein the different planes are generally parallel to each other.

28. The apparatus of claim 21, wherein the molded electrical connector is covered with resin.

* * * * *